(12) United States Patent
Zuo et al.

(10) Patent No.: US 9,406,865 B2
(45) Date of Patent: Aug. 2, 2016

(54) COMPOSITE PIEZOELECTRIC LATERALLY VIBRATING RESONATOR

(75) Inventors: Chengjie Zuo, San Diego, CA (US); Changhan Hobie Yun, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 381 days.

(21) Appl. No.: 13/587,618

(22) Filed: Aug. 16, 2012

(65) Prior Publication Data

US 2013/0214643 A1   Aug. 22, 2013

Related U.S. Application Data

(60) Provisional application No. 61/525,607, filed on Aug. 19, 2011.

(51) Int. Cl.
- *H01L 41/09* (2006.01)
- *H01L 41/18* (2006.01)
- *H03H 9/02* (2006.01)
- *H01L 41/277* (2013.01)

(52) U.S. Cl.
CPC ............ *H01L 41/183* (2013.01); *H01L 41/277* (2013.01); *H03H 9/02015* (2013.01); *H03H 9/02228* (2013.01); *Y10T 29/42* (2015.01)

(58) Field of Classification Search
USPC .................................. 310/328, 358, 363–366
See application file for complete search history.

(56) References Cited

U.S. PATENT DOCUMENTS

| | | | |
|---|---|---|---|
| 4,703,287 A * | 10/1987 | Fournier et al. | 359/279 |
| 6,452,310 B1 | 9/2002 | Panasik | |
| 6,590,316 B2 * | 7/2003 | Koike et al. | 310/358 |
| 6,975,183 B2 | 12/2005 | Aigner et al. | |
| 6,987,348 B2 * | 1/2006 | Buhler et al. | 310/330 |
| 7,554,427 B2 | 6/2009 | Matsumoto et al. | |
| 7,586,390 B2 | 9/2009 | Matsumoto et al. | |
| 7,687,971 B2 | 3/2010 | Stokes et al. | |
| 2008/0174205 A1 * | 7/2008 | Iino | 310/317 |
| 2008/0252178 A1 | 10/2008 | Yamada | |

(Continued)

FOREIGN PATENT DOCUMENTS

| | | | | |
|---|---|---|---|---|
| CN | 101346828 A | 1/2009 | | |
| GB | 865093 | * | 4/1961 | H03H 9/54 |

(Continued)

OTHER PUBLICATIONS

Abdolvand, et al., "Thin-Film Piezoelectric-on-Silicon Resonators for High-Frequency Reference Oscillator Applications," IEEE Transactions on Ultrasonics, Ferroelectrics, and Frequency Control, vol. 55, No. 12, Dec. 2008, pp. 2596-2606.

Gryba, et al., "ZnO Contour-Mode Resonator," 10eme Congres Francais d'Acoustique, Lyon, Apr. 12-16, 2010, 6 pages.

Piazza, et al., "Piezoelectric Aluminum Nitride Vibrating Contour-Mode MEMS Resonators," Journal of Microelectromechanical Systems, vol. 15, No. 6, Dec. 2006, pp. 1406-1418.

(Continued)

*Primary Examiner* — Thomas Dougherty
(74) *Attorney, Agent, or Firm* — James Gutierrez

(57) ABSTRACT

A resonator is described. The resonator includes multiple electrodes. The resonator also includes a composite piezoelectric material. The composite piezoelectric material includes at least one layer of a first piezoelectric material and at least one layer of a second piezoelectric material. At least one electrode is coupled to a bottom of the composite piezoelectric material. At least one electrode is coupled to a top of the composite piezoelectric material.

15 Claims, 9 Drawing Sheets

(56) References Cited

U.S. PATENT DOCUMENTS

2008/0284286 A1  11/2008  Ogawa et al.
2011/0304412 A1  12/2011  Zhang
2012/0274184 A1  11/2012  Stephanou et al.

FOREIGN PATENT DOCUMENTS

| JP | 2-222584 | * | 9/1990 | ............... H01L 41/09 |
| JP | H118111 A | | 1/1999 | |
| JP | 2000307377 A | | 11/2000 | |
| JP | 2001203558 A | | 7/2001 | |
| JP | 2003051732 A | | 2/2003 | |
| JP | 2007173679 A | | 7/2007 | |
| JP | 2007312164 A | | 11/2007 | |
| JP | 2008516490 A | | 5/2008 | |
| JP | 2008-211392 | * | 9/2008 | ............... H03H 9/17 |
| JP | 2008210895 A | | 9/2008 | |
| WO | WO-2008016075 A1 | | 2/2008 | |

OTHER PUBLICATIONS

International Search Report and Written Opinion—PCT/US2012/051626—ISA/EPO—Mar. 5, 2013.

Mansfeld G.D., et al.,"Parametric excitation of bulk acoustic wave composite resonators", Proceedings / 2000 IEEE Ultrasonics Symposium : October 22-25, 2000, Hotel Caribe Hilton, San Juan, Puerto Rico ; An International Symposium, IEEE Service Center, Piscataway, NJ, vol. 1, Oct. 22, 2000, pp. 859-862, XP010541722, ISBN: 978-0-7803-6365-6.

Partial International Search Report—PCT/US2012/051626—ISA/EPO—Dec. 5, 2012.

Yanagitani T., et al.,"c-Axis Zig-Zag ZnO film ultrasonic transducers for designing longitudinal and shear wave resonant frequencies and modes", IEEE Transactions on Ultrasonics, Ferroelectrics and Frequency Control, IEEE, US, vol. 58, No. 5, May 1, 2011, pp. 1062-1068, XP011324600, ISSN: 0885-3010, DOI: 10.1109/TUFFC.2011.1906.

* cited by examiner

COMPOSITE PIEZOELECTRIC LATERALLY VIBRATING RESONATOR

RELATED APPLICATIONS

This application is related to and claims priority from U.S. Provisional Patent Application Ser. No. 61/525,607, filed Aug. 19, 2011, for "COMPOSITE PIEZOELECTRIC LATERALLY VIBRATING RESONATORS AND FILTERS," which is incorporated herein by reference.

TECHNICAL FIELD

The present disclosure relates generally to wireless communication systems. More specifically, the present disclosure relates to systems and methods for a composite piezoelectric laterally vibrating resonator.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Various electronic circuit components can be implemented at the electromechanical systems level, such as resonators. Some conventional resonator structures provide less than desirable electrical and mechanical energy conversion. These less than desirable attributes may render such conventional resonators unfit for use in circuits, such as wideband filters. Thus, there is a need for electromechanical systems level resonators with improved electrical and mechanical energy conversion.

SUMMARY

A resonator is described. The resonator includes multiple electrodes. The resonator also includes a composite piezoelectric material that includes at least one layer of a first piezoelectric material and at least one layer of a second piezoelectric material. At least one electrode is coupled to a bottom of the composite piezoelectric material. At least one electrode is coupled to a top of the composite piezoelectric material.

The resonator may be a laterally vibrating microelectromechanical system composite resonator. The first piezoelectric material may have a first quality factor and a first electromechanical coupling. The second piezoelectric material may have a second quality factor and a second electromechanical coupling. The composite piezoelectric material may have a composite quality factor and a composite electromechanical coupling. The composite quality factor and the composite electromechanical coupling may depend on a volume ratio in the composite piezoelectric material between the first piezoelectric material and the second piezoelectric material.

The composite quality factor and the composite electromechanical coupling may instead depend on a thickness ratio in the composite piezoelectric material between a first thickness of a first layer of the first piezoelectric material and a second thickness of a first layer of the second piezoelectric material.

The composite piezoelectric material may include a first layer of the first piezoelectric material and a first layer of the second piezoelectric material. The first layer of the first piezoelectric material may be stacked on top of the first layer of the second piezoelectric material. The composite piezoelectric material may also include a second layer of the first piezoelectric material. The first layer of the second piezoelectric material may be stacked on top of the second layer of the first piezoelectric material. The composite piezoelectric material may further include a second layer of the second piezoelectric material. The second layer of the first piezoelectric material may be stacked on top of the second layer of the second piezoelectric material.

The first layer of the first piezoelectric material may be stacked side by side with the first layer of the second piezoelectric material. A first electrode may be coupled to the top of both the first layer of the first piezoelectric material and the first layer of the second piezoelectric material. A second electrode may be coupled to the bottom of both the first layer of the first piezoelectric material and the first layer of the second piezoelectric material.

The first layer of the second piezoelectric material may instead be sandwiched between the first layer of the first piezoelectric material and the second layer of the first piezoelectric material. The second layer of the first piezoelectric material may be sandwiched between the first layer of the second piezoelectric material and the second layer of the second piezoelectric material.

The composite piezoelectric material may translate input signals from one or more input electrodes into mechanical vibrations. The mechanical vibrations may be translated to an output signal from one or more output electrodes. The first piezoelectric material may be aluminum nitride and the second piezoelectric material may be zinc oxide. In another configuration, the first piezoelectric material may be aluminum nitride and the second piezoelectric material may be lead zirconate titanate. The composite piezoelectric material may have a high enough composite quality factor and composite electromechanical coupling for use in wideband filter applications.

A method for generating a resonator is also described. A desired quality factor for the resonator is determined A desired electromechanical coupling for the resonator is also determined A first piezoelectric material and a second piezoelectric material are selected for use in the resonator. A volume ratio between the first piezoelectric material and the second piezoelectric material is adjusted to obtain a composite piezoelectric material with the desired quality factor and the desired electromechanical coupling. The resonator is generated using the composite piezoelectric material.

An apparatus configured for generating a resonator is described. The apparatus includes means for determining a desired quality factor for the resonator. The apparatus also includes means for determining a desired electromechanical coupling for the resonator. The apparatus further includes means for selecting a first piezoelectric material and a second piezoelectric material for use in the resonator. The apparatus also includes means for adjusting a volume ratio between the first piezoelectric material and the second piezoelectric material to obtain a composite piezoelectric material with the desired quality factor and the desired electromechanical coupling. The apparatus further includes means for generating the resonator using the composite piezoelectric material.

A computer-program product for generating a resonator is also described. The computer-program product includes a non-transitory computer-readable medium having instructions thereon. The instructions include code for causing an apparatus to determine a desired quality factor for the resonator. The instructions also include code for causing the apparatus to determine a desired electromechanical coupling for the resonator. The instructions further include code for causing the apparatus to select a first piezoelectric material and a second piezoelectric material for use in the resonator. The instructions also include code for causing the apparatus to adjust a volume ratio between the first piezoelectric material and the second piezoelectric material to obtain a composite piezoelectric material with the desired quality factor and the desired electromechanical coupling. The instructions further include code for causing the apparatus to generate the resonator using the composite piezoelectric material.

DETAILED DESCRIPTION

Figure 1:
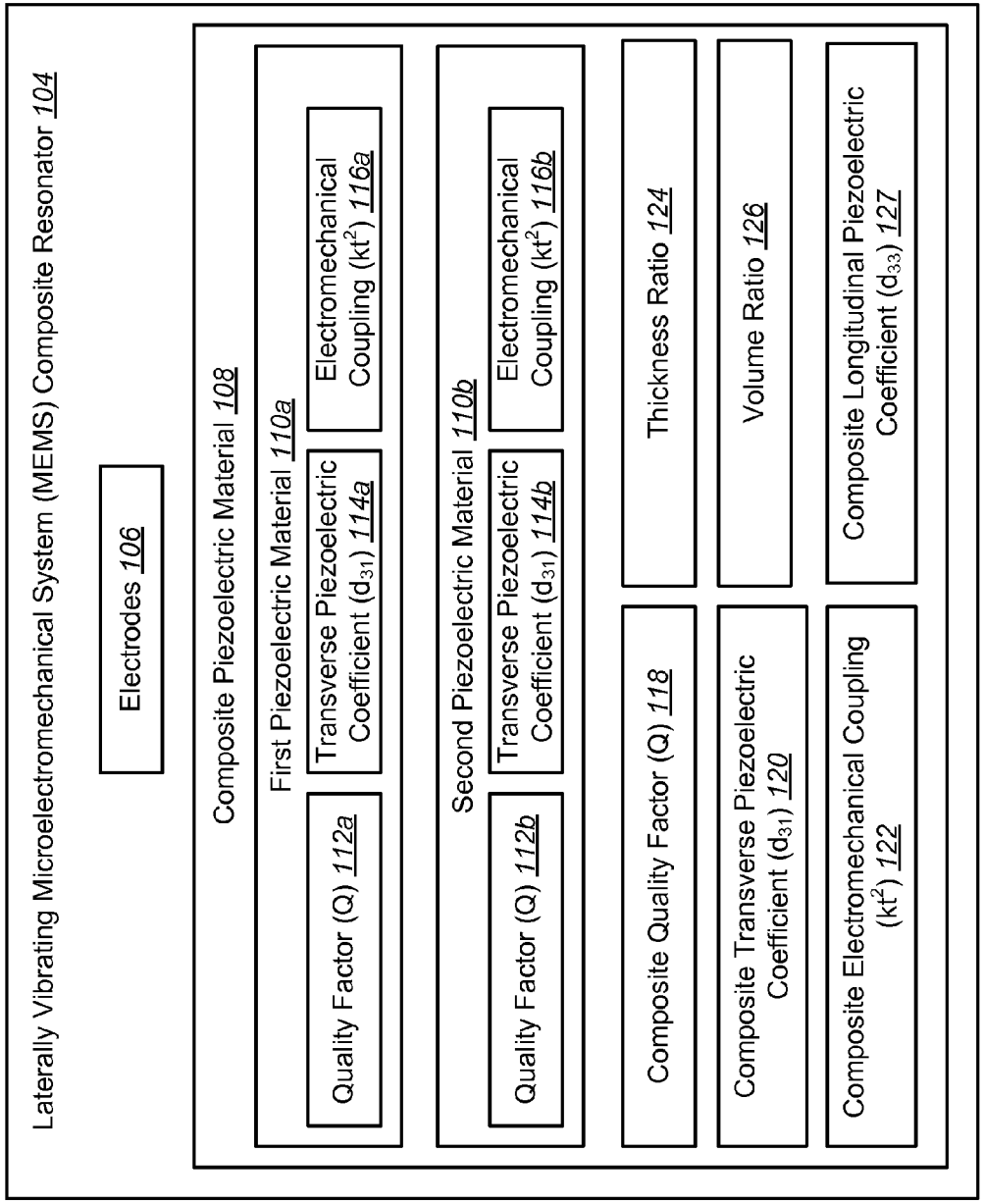
FIG. 1 is a block diagram illustrating a laterally vibrating microelectromechanical system (MEMS) composite resonator.

FIG. 1 is a block diagram illustrating a laterally vibrating microelectromechanical system (MEMS) composite resonator 104. One example of an electromechanical systems resonator device is a contour mode resonator (CMR). A contour mode resonator (CMR) has substantially lateral and in-plane modes of vibration. A laterally vibrating microelectromechanical system (MEMS) composite resonator 104 may thus be one configuration of a contour mode resonator (CMR).

In general, a laterally vibrating microelectromechanical system (MEMS) composite resonator 104 may include multiple conductive electrodes 106 with a composite piezoelectric material 108 sandwiched between the electrodes 106. The electrodes 106 may include one or more input electrodes 106 coupled to an input port and one or more output electrodes 106 coupled to an output port. Ground electrodes 106 may be interdigitated among the input and output electrodes 106. As used herein, laterally vibrating refers to single-chip multi-frequency operation, in contrast with conventional quartz crystal and film bulk acoustic wave resonator (FBAR) technologies for which only one center frequency is allowed per wafer.

The laterally vibrating microelectromechanical system (MEMS) composite resonator 104 structure may be suspended in a cavity that includes specially designed tethers coupling the laterally vibrating microelectromechanical system (MEMS) composite resonator 104 structure to a supporting structure. These tethers may be fabricated in the layer stack of the resonator 104 structure. The resonator 104 structure can be acoustically isolated from the surrounding structural support and other components by virtue of the cavity.

Many different kinds of electronic devices may benefit from a laterally vibrating microelectromechanical system (MEMS) composite resonator 104. Different kinds of such devices include, but are not limited to, cellular telephones, wireless modems, computers, digital music players, Global Positioning System units, Personal Digital Assistants, gaming devices, etc. One group of devices includes those that may be used with wireless communication systems. As used herein, the term "wireless communication device" refers to an electronic device that may be used for voice and/or data communication over a wireless communication network. Examples of wireless communication devices include cellular phones, handheld wireless devices, wireless modems, laptop computers, personal computers, etc. A wireless communication device may alternatively be referred to as an access terminal, a mobile terminal, a subscriber station, a remote station, a user terminal, a terminal, a subscriber unit, user equipment, a mobile station, etc.

A wireless communication network may provide communication for a number of wireless communication devices, each of which may be serviced by a base station. A base station may alternatively be referred to as an access point, a Node B, or some other terminology. Base stations and wireless communication devices may make use of laterally vibrating microelectromechanical system (MEMS) composite resonators 104. However, many different kinds of electronic devices, in addition to the wireless devices mentioned, may make use of laterally vibrating microelectromechanical system (MEMS) composite resonators 104.

The resonant frequency of a contour mode resonator (CMR), such as the laterally vibrating microelectromechanical system (MEMS) composite resonator 104, may be substantially controlled by engineering the lateral dimensions of the composite piezoelectric material 108 and the electrodes 106. One benefit of such a construction is that multi-frequency RF filters, clock oscillators, transducers or other devices that each include one or more contour mode resonators (CMRs) can be fabricated on the same substrate. This may be advantageous in terms of cost and size by enabling compact, multi-band filter solutions for RF front-end applications on a single chip. The laterally vibrating microelectromechanical system (MEMS) composite resonator 104 may provide the advantages of compact size (e.g., 100 micrometers (µm) in length and/or width), low power consumption and compatibility with high-yield mass-producible components.

Typically only a single piezoelectric material is used in a resonator. For example, a single piezoelectric material may be used in a single-port or two-port laterally vibrating resonator. As another example, a single piezoelectric material may be used in a one-port piezoelectric-on-substrate laterally vibrating resonator (for all types of electrode 106 configurations). Different piezoelectric materials may be used as the single piezoelectric material.

In one configuration, the single piezoelectric material may be aluminum nitride (AlN). AlN may have a high quality factor (Q) 112, resulting in low motional resistance and low filter insertion loss. However, AlN may have a limited transverse piezoelectric coefficient ($d_{31}$) 114, resulting in limited electromechanical coupling ($kt^2$) 116. Thus, laterally vibrating AlN microelectromechanical systems (MEMS) resonators may not be ideal for wideband filter applications.

In another configuration, the single piezoelectric material may be zinc oxide (ZnO) or lead zirconate titanate (PZT). ZnO and PZT have a relatively larger transverse piezoelectric coefficient ($d_{31}$) 114 and electromechanical coupling ($kt^2$) 116 (especially for PZT) than AlN, making their use in wideband filter applications more ideal. However, ZnO and PZT have a low quality factor (Q) 112 and therefore have a large motional resistance and a large filter insertion loss.

For a one-port piezoelectric-on-substrate laterally vibrating resonator, the single piezoelectric material may be ZnO, AlN, PZT or other piezoelectric material and the substrate may be silicon, diamond or other non-piezoelectric material. The resonator body may mainly be the non-piezoelectric substrate. Therefore, the effective composite electromechanical coupling ($kt^2$) 116 is small and unfavorable for wideband filter applications. A one-port piezoelectric-on-substrate laterally vibrating resonator may have a high quality factor (Q) 112 and low insertion loss for narrowband filters (e.g., a fractional filter bandwidth<1%).

The composite piezoelectric material 108 may include a first piezoelectric material 110a and a second piezoelectric material 110b. The first piezoelectric material 110a and the second piezoelectric material 110b may each form one or more layers. The layers may be coupled to each other or separated by an electrode 106 (such as a ground electrode 106). Different configurations for the layers of the first piezoelectric material 110a and the second piezoelectric material 110b may be used (along with the corresponding electrode 106 layers as needed for different electrode 106 configurations). For example, a layer of the first piezoelectric material 110a may be placed directly on top of a layer of the second piezoelectric material 110b. The main resonator body may be only the composite piezoelectric material 108.

In one configuration, the first piezoelectric material 110a may be AlN and the second piezoelectric material 110b may be PZT or ZnO. However, additional piezoelectric materials not mentioned herein may also be used as either the first piezoelectric material 110a or the second piezoelectric material 110b.

The first piezoelectric material 110a may have a quality factor (Q) 112a, a transverse piezoelectric coefficient ($d_{31}$) 114a and an electromechanical coupling ($kt^2$) 116a. The second piezoelectric material 110b may have a quality factor (Q) 112b, a transverse piezoelectric coefficient ($d_{31}$) 114b and an electromechanical coupling ($kt^2$) 116b. The composite piezoelectric material 108 may have a composite quality factor (Q) 118, a composite transverse piezoelectric coefficient ($d_{31}$) 120 and a composite electromechanical coupling ($kt^2$) 122. The composite quality factor (Q) 118, composite transverse piezoelectric coefficient ($d_{31}$) 120 and composite electromechanical coupling ($kt^2$) 122 may be designed based on the volume ratio 126 and/or the thickness ratio 124 of the first piezoelectric material 110a and the second piezoelectric material 110b. For example, in one configuration the first piezoelectric material 110a may be AlN (with a high quality factor (Q) 112) and the second piezoelectric material 110b may be ZnO (with a high electromechanical coupling ($kt^2$) 116). The composite piezoelectric material 108 may then have a composite quality factor (Q) 118 that is sufficient for wideband filter applications and a composite electromechanical coupling ($kt^2$) 122 that is sufficient for wideband filter applications.

The composite piezoelectric material 108 may translate input signal(s) from one or more electrodes 106 into mechanical vibration, which can then be translated to the output signal(s). These mechanical vibrations may be the resonant frequency of the laterally vibrating microelectromechanical system (MEMS) composite resonator 104. Based on finger widths of the electrodes 106, the resonant frequencies of the structure may be controlled. The fundamental frequency for the displacement of the composite piezoelectric material 108 can be set in part lithographically by the planar dimensions of the electrodes 106 and/or the layer of the composite piezoelectric material 108.

An AC electric field applied across the electrodes 106 may induce mechanical deformations in one or more planes of the composite piezoelectric material 108 via the composite transverse piezoelectric coefficient ($d_{31}$) 120 or composite longitudinal piezoelectric coefficient ($d_{33}$) 127. At the resonant frequency of the laterally vibrating microelectromechanical system (MEMS) composite resonator 104, the electrical signal across the device is reinforced and the device behaves as an electronic resonator circuit.

In one configuration, the total width multiplied by the total length of the laterally vibrating microelectromechanical system (MEMS) composite resonator 104 may be set to control the impedance of the resonator structure. A suitable thickness of the composite piezoelectric material 108 may be 0.01 to 10 micrometers (μm) thick.

The use of a composite piezoelectric material 108 may apply to all different electrode 106 configurations that have been demonstrated for single-piezoelectric or piezoelectric-on-substrate resonators. With more layers of piezoelectric materials 110 and metal layers, other new electrode 106 configurations may also be developed.

The laterally vibrating microelectromechanical system (MEMS) composite resonator 104 may be used to synthesize wideband (with a fractional bandwidth>3%) filters at various center frequencies (from 10 megahertz (MHz) up to microwave frequencies) on the same chip for multi-band/multi-mode wireless communications, which is not achievable using existing technology. Multiple laterally vibrating microelectromechanical system (MEMS) composite resonators 104 may be electrically (e.g., in a ladder, lattice or self-coupling topology) and/or mechanically coupled to synthesize high-order bandpass filters with different center frequencies and bandwidths (narrow or wide) on a single chip. Different excitation schemes (e.g., thickness field excitation and lateral field excitation) can be used to excite all different kinds of vibration modes (width-extensional, length-extensional, thickness-extensional, Lamb wave, shear mode, etc.) in laterally vibrating microelectromechanical system (MEMS) composite resonators 104.

The piezoelectric materials 110 used in a composite piezoelectric material 108 may be fabricated on top of one another or side by side. In addition, separate single-piezoelectric resonators with different piezoelectric materials 110 may be fabricated next to each other (or even side by side) on the same chip to obtain the composite piezoelectric material 108 for the laterally vibrating microelectromechanical system (MEMS) composite resonator 104. Thus, multiple resonators may be electrically connected in parallel or mechanically coupled to realize the laterally vibrating microelectromechanical system (MEMS) composite resonator 104. Due to the different acoustic velocities of different piezoelectric materials 110, single-device multi-frequency operation can also be designed in a laterally vibrating microelectromechanical system (MEMS) composite resonator 104 that includes a composite piezoelectric material 108.

Figure 2:
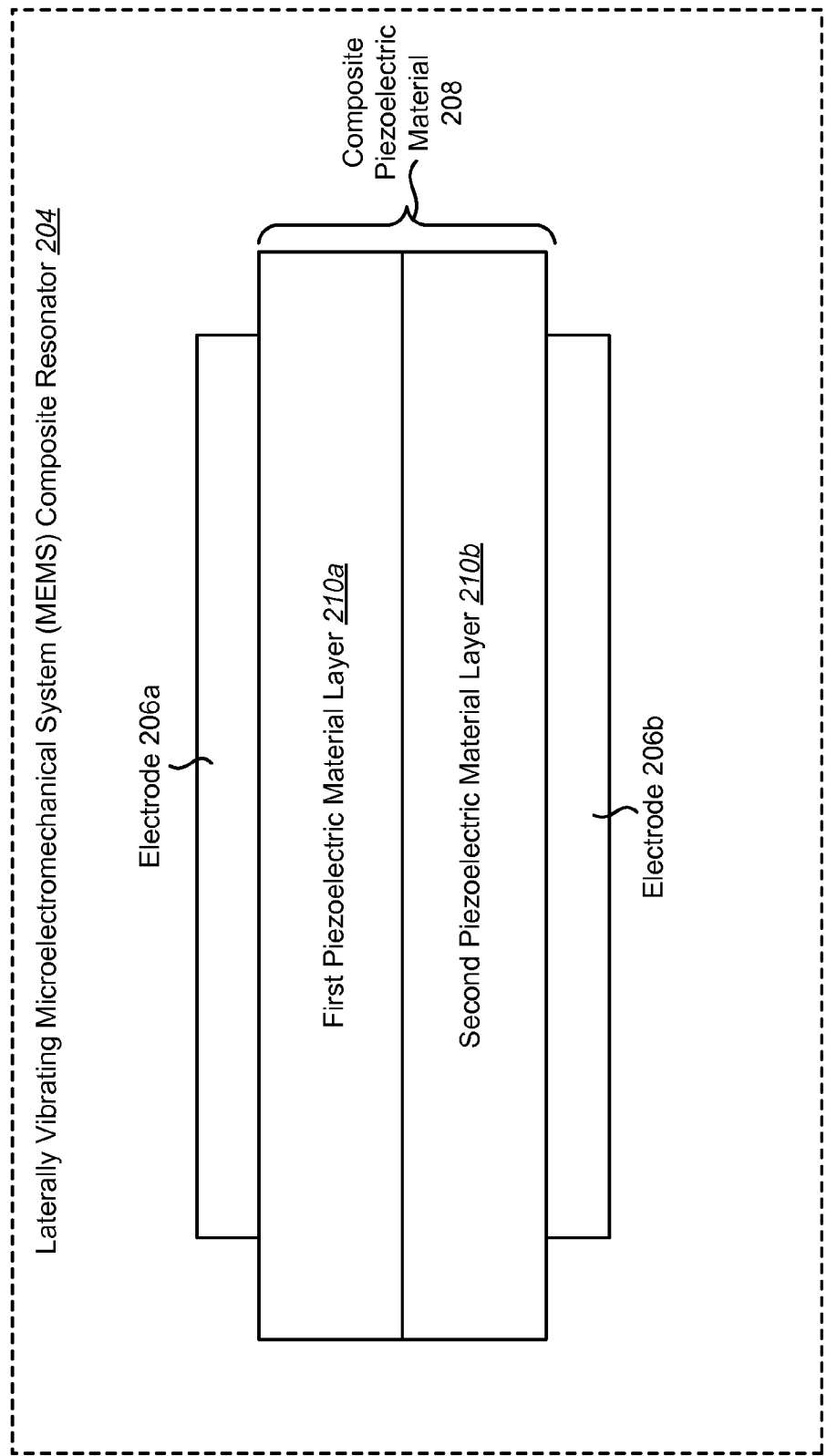
FIG. 2 illustrates a laterally vibrating microelectromechanical system (MEMS) composite resonator for use in the present systems and methods.

FIG. 2 illustrates a laterally vibrating microelectromechanical system (MEMS) composite resonator 204 for use in the present systems and methods. The laterally vibrating microelectromechanical system (MEMS) composite resonator 204 of FIG. 2 may be one configuration of the laterally vibrating microelectromechanical system (MEMS) composite resonator 104 of FIG. 1. The laterally vibrating microelectromechanical system (MEMS) composite resonator 204 may include a composite piezoelectric material 208 that includes a layer 210a of a first piezoelectric material 110a and a layer 210b of a second piezoelectric material 110b. The layer 210a of the first piezoelectric material 110a may be directly on top of the layer 210b of the second piezoelectric material 110b. A first electrode 206a may be coupled to the layer 210a of the first piezoelectric material 110a and a second electrode 206b may be coupled to the layer 210b of the second piezoelectric material 110b.

Figure 3:
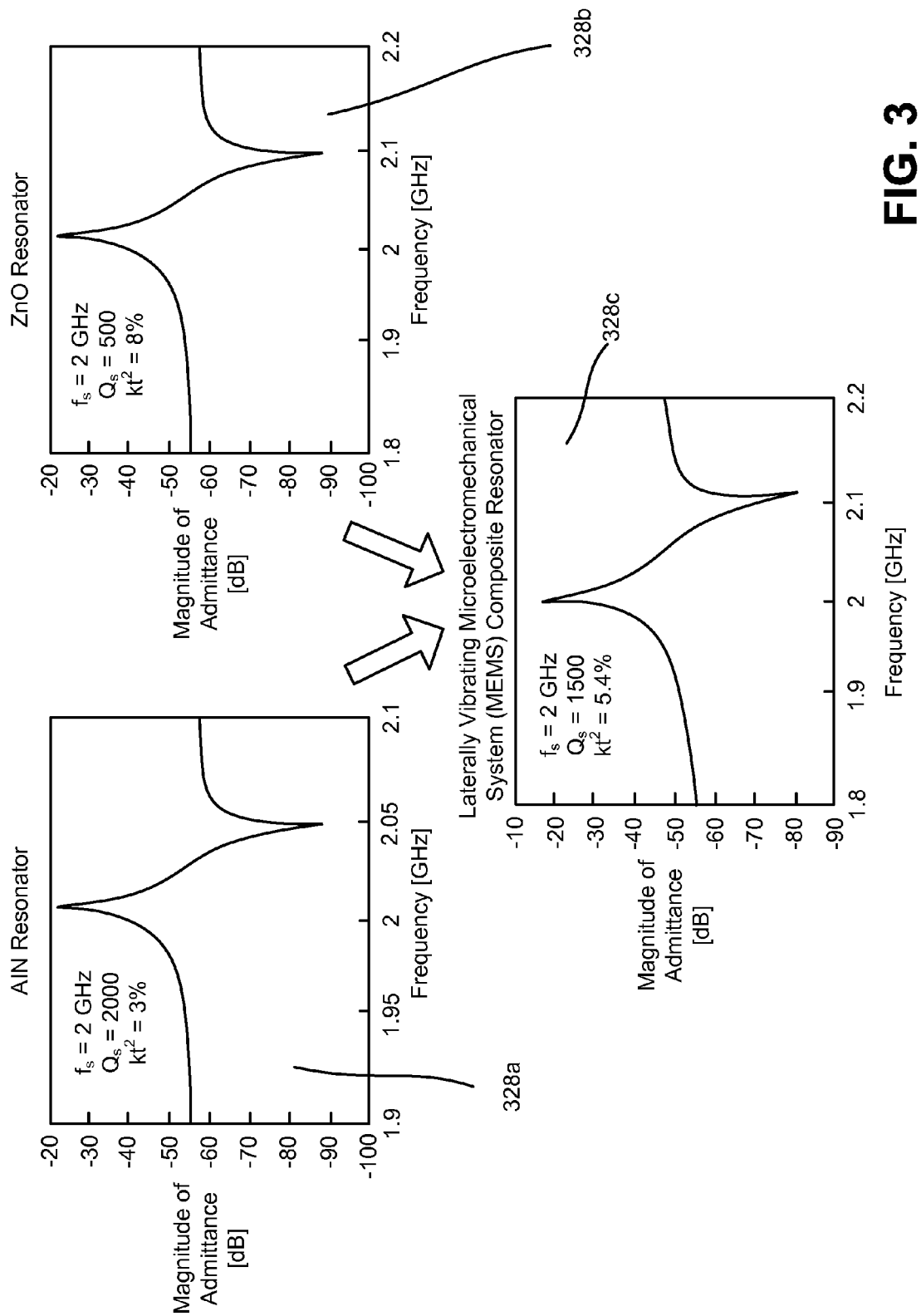
FIG. 3 illustrates graphs of simulation results for three different resonators.

FIG. 3 illustrates graphs 328a-c of simulation results for three different resonators. In each graph, the magnitude of admittance (in decibels (dB)) is plotted versus the frequency (in gigahertz (GHz)). The first graph 328a illustrates simulation results for a resonator with AlN used as the single piezoelectric material 110. The second graph 328b illustrates simulation results for a resonator with ZnO used as the single piezoelectric material 110. The third graph 328c illustrates simulation results for a laterally vibrating microelectromechanical system (MEMS) composite resonator 104 with AlN used as the first piezoelectric material 110a and ZnO as the second piezoelectric material 110b.

In the first graph 328a, the resonant frequency fs is 2 GHz, the quality factor (Q) 112 is 2000 and the electromechanical coupling ($kt^2$) 116 is 3%. In the second graph 328b, the resonant frequency fs is 2 GHz, the quality factor (Q) 112 is 500 and the electromechanical coupling ($kt^2$) 116 is 8%. Thus, the resonator with AlN used as the single piezoelectric material 110 has a high quality factor (Q) 112 and a low electromechanical coupling ($kt^2$) 116 while the resonator with ZnO used as the single piezoelectric material 110 has a low quality factor (Q) 112 and a high electromechanical coupling ($kt^2$) 116. By designing a laterally vibrating microelectromechanical system (MEMS) composite resonator 104 that uses a layer of AlN and a layer of ZnO, a resonant frequency of 2 GHz, a composite quality factor (Q) 118 of 1500 and a composite electromechanical coupling ($kt^2$) 122 of 5.4% may be achieved. Thus, the laterally vibrating microelectromechanical system (MEMS) composite resonator 104 has the advantage of the AlN resonator in terms of high composite quality factor (Q) 118 and the advantage of the ZnO resonator in terms of high composite electromechanical coupling ($kt^2$) 122.

Figure 4:
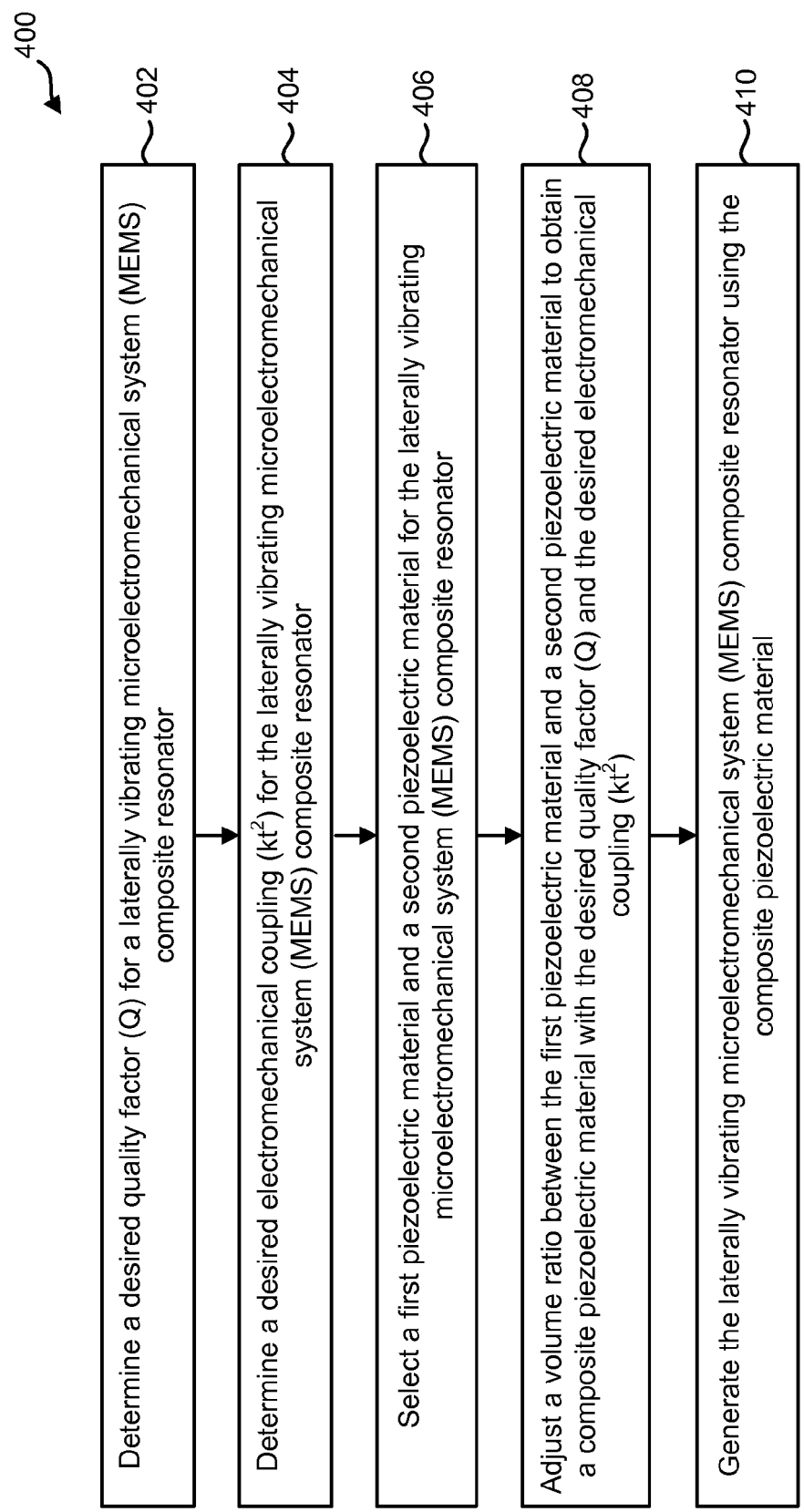
FIG. 4 is a flow diagram of a method for generating a laterally vibrating microelectromechanical system (MEMS) composite resonator.

FIG. 4 is a flow diagram of a method 400 for generating a laterally vibrating microelectromechanical system (MEMS) composite resonator 104. The method 400 may be performed by an engineer, a technician or a computer. In one configuration, the method 400 may be performed by a fabrication machine.

A desired quality factor (Q) (i.e., a composite quality factor (Q) 118) for a laterally vibrating microelectromechanical system (MEMS) composite resonator 104 may be determined 402. A desired electromechanical coupling ($kt^2$) (composite electromechanical coupling ($kt^2$) 122) for the laterally vibrating microelectromechanical system (MEMS) composite resonator 104 may also be determined 404. A first piezoelectric material 110a and a second piezoelectric material 110b may be selected 406 for the laterally vibrating microelectromechanical system (MEMS) composite resonator 104. A thickness ratio 124 (or volume ratio 126) between the first piezoelectric material 110a and the second piezoelectric material 110b may be adjusted 408 to obtain a composite piezoelectric material 108 with the desired quality factor (Q) and the desired electromechanical coupling ($kt^2$). The laterally vibrating microelectromechanical system (MEMS) composite resonator 104 may then be generated 410 using the composite piezoelectric material 108.

Figure 5:
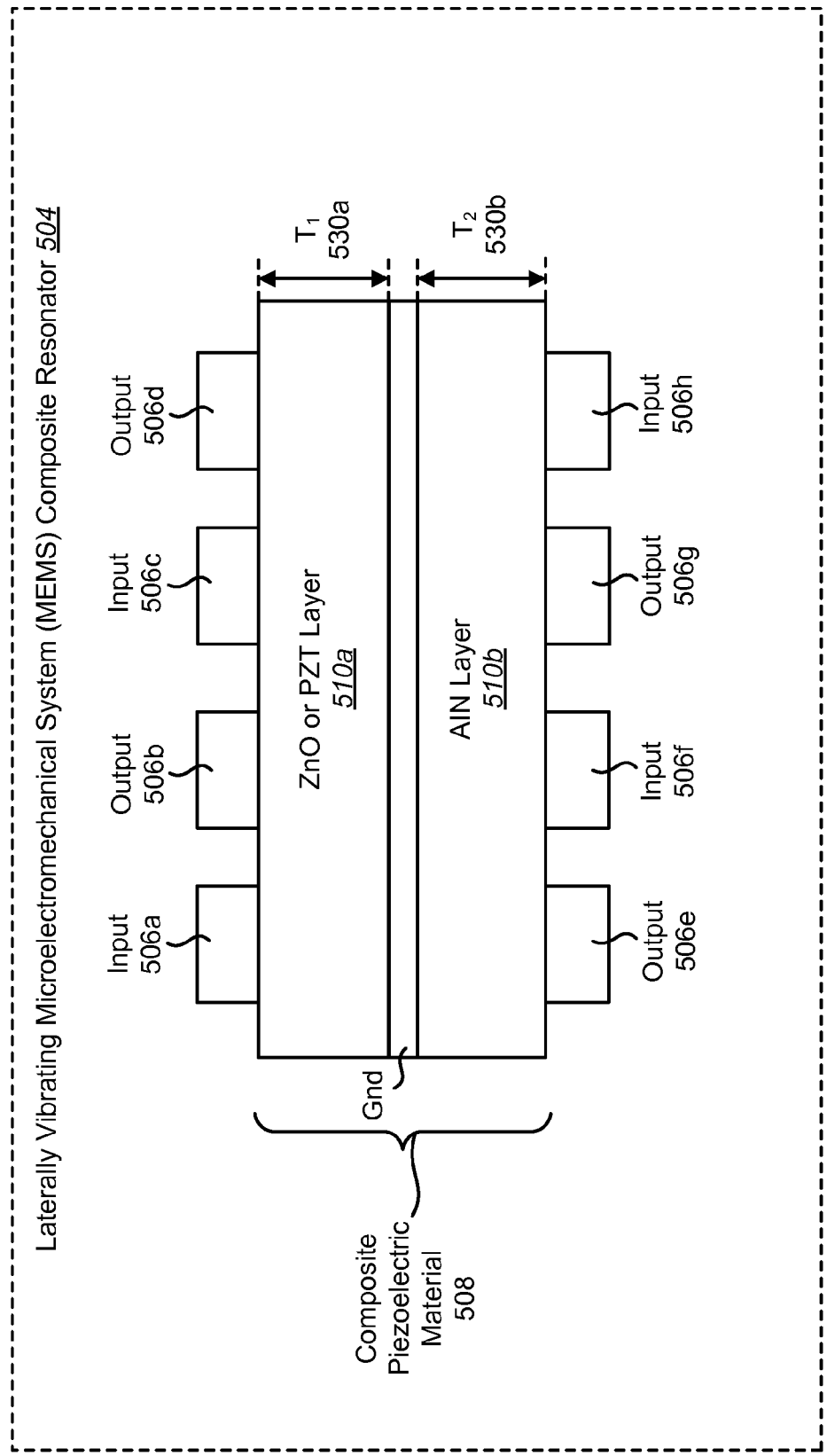
FIG. 5 illustrates another laterally vibrating microelectromechanical system (MEMS) composite resonator for use in the present systems and methods.

FIG. 5 illustrates another laterally vibrating microelectromechanical system (MEMS) composite resonator 504 for use in the present systems and methods. The laterally vibrating microelectromechanical system (MEMS) composite resonator 504 of FIG. 5 may be one configuration of the laterally vibrating microelectromechanical system (MEMS) composite resonator 104 of FIG. 1. The laterally vibrating microelectromechanical system (MEMS) composite resonator 504 may include a composite piezoelectric material 508 that includes a layer 510a of a first piezoelectric material 110a (ZnO or PZT) and a layer 510b of a second piezoelectric material 110b (AlN).

The layer 510a of the first piezoelectric material 110a may be coupled to the layer 510b of the second piezoelectric material 110b via a ground (GND) layer. Multiple input and output electrodes 506a-d may be coupled to the layer 510a of the first piezoelectric material 110a. Multiple input and output electrodes 506e-h may also be coupled to the layer 510b of the second piezoelectric material 110b.

The layer 510a of the first piezoelectric material 110a may have a thickness of T1 530a and the layer 510b of the second piezoelectric material 110b may have a thickness of T2 530b. By adjusting the ratio 124 between the thickness T1 530a and the thickness T2 530b, the composite quality factor (Q) 118 and the composite electromechanical coupling ($kt^2$) 122 of the composite piezoelectric material 508 may be adjusted. For example, if the first piezoelectric material 110a has a high quality factor (Q) 112a but a low electromechanical coupling ($kt^2$) 116 and a higher composite quality factor (Q) 118 is desired (at the expense of the composite electromechanical coupling ($kt^2$) 122), the thickness T1 530a may be increased relative to the thickness T2 530b.

Figure 6:
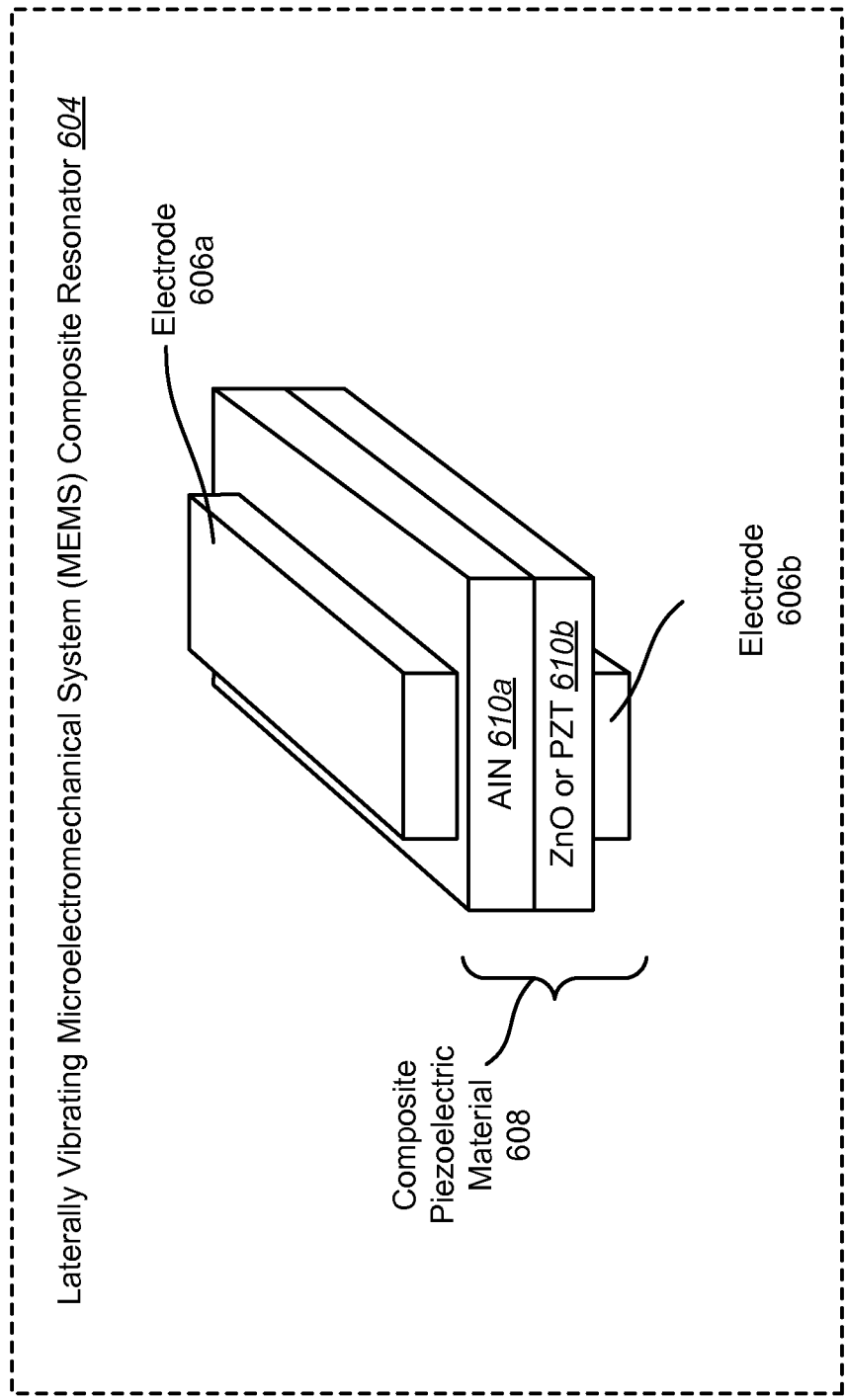
FIG. 6 illustrates yet another laterally vibrating microelectromechanical system (MEMS) composite resonator for use in the present systems and methods.

FIG. 6 illustrates yet another laterally vibrating microelectromechanical system (MEMS) composite resonator 604 for use in the present systems and methods. The laterally vibrating microelectromechanical system (MEMS) composite resonator 604 of FIG. 6 may be one configuration of the laterally vibrating microelectromechanical system (MEMS) composite resonator 104 of FIG. 1. The laterally vibrating microelectromechanical system (MEMS) composite resonator 604 may include a composite piezoelectric material 608 that includes a layer 610a of a first piezoelectric material 110a (AlN) and a layer 610b of a second piezoelectric material 110b (ZnO or PZT).

The layer 610a of the first piezoelectric material 110a may be coupled to the layer 610b of the second piezoelectric material 110b. A first electrode 606a may be coupled to the layer 610a of the first piezoelectric material 110a and a second electrode 606b may be coupled to the layer 610b of the second piezoelectric material 110b.

The first piezoelectric material 110a may have a first volume and the second piezoelectric material 110b may have a second volume. By adjusting the ratio 126 between the first volume and the second volume, the composite quality factor (Q) 118 and the composite electromechanical coupling ($kt^2$) 122 of the composite piezoelectric material 608 may be adjusted. For example, if the first piezoelectric material 110a has a high quality factor (Q) 112a but a low electromechanical coupling ($kt^2$) 116a and a higher composite quality factor (Q) 118 is desired (at the expense of composite electromechanical coupling ($kt^2$) 122), the first volume may be increased relative to the second volume.

Figure 7:
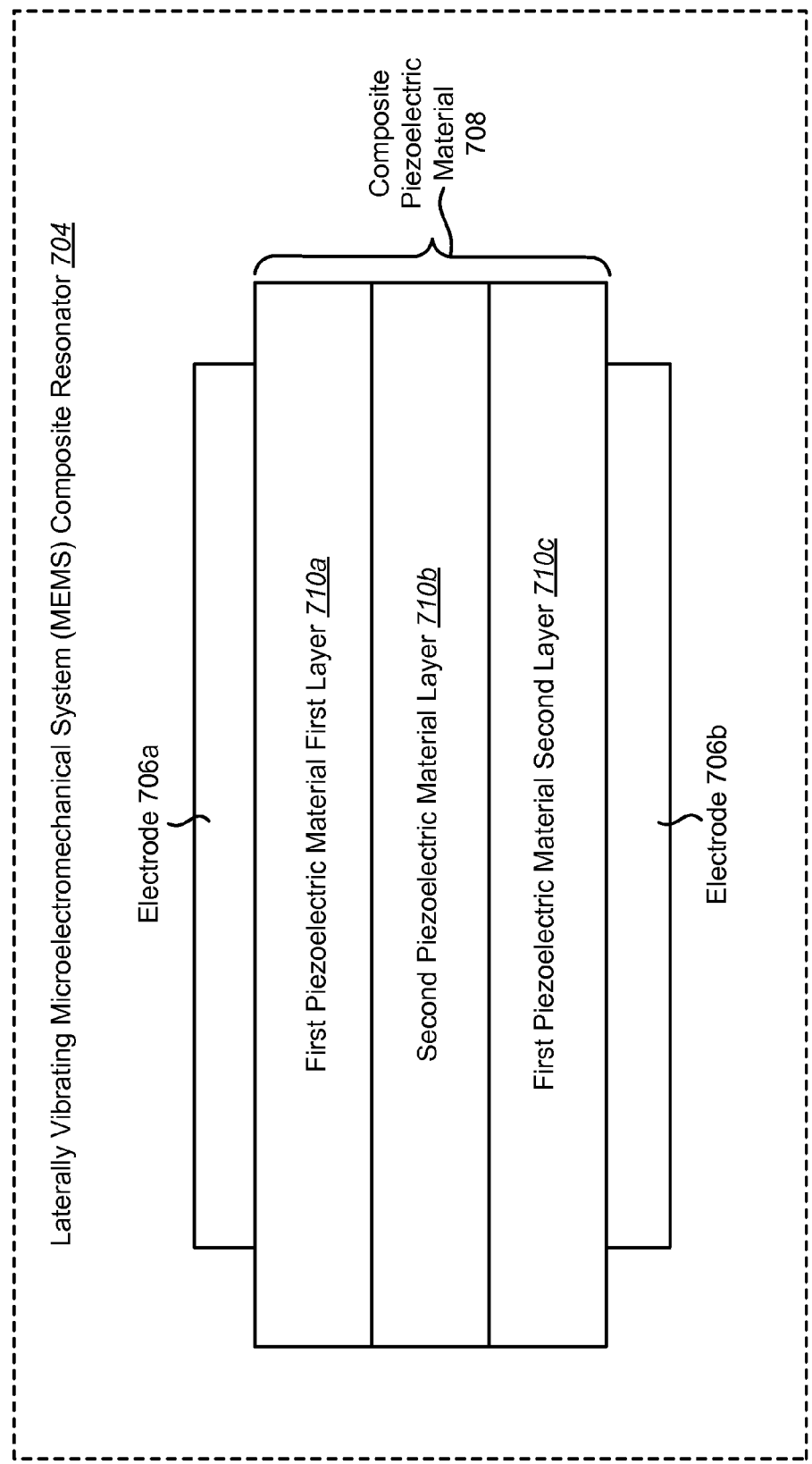
FIG. 7 is a block diagram illustrating a laterally vibrating microelectromechanical system (MEMS) composite resonator with three vertical layers of piezoelectric material.

FIG. 7 is a block diagram illustrating a laterally vibrating microelectromechanical system (MEMS) composite resonator 704 with three vertical layers 710a-c of piezoelectric material 110. The laterally vibrating microelectromechanical system (MEMS) composite resonator 704 of FIG. 7 may be one configuration of the laterally vibrating microelectromechanical system (MEMS) composite resonator 104 of FIG. 1. The laterally vibrating microelectromechanical system (MEMS) composite resonator 704 may include a composite piezoelectric material 708 that includes a first layer 710*a* of a first piezoelectric material 110*a*, a layer 710*b* of a second piezoelectric material 110*b* and a second layer 710*c* of the first piezoelectric material 110*a*. The layer 710*b* of the second piezoelectric material 110*b* may be sandwiched between the first layer 710*a* of the first piezoelectric material 110*a* and the second layer 710*c* of the first piezoelectric material 110*a* (i.e., the first layer 710*a* of the first piezoelectric material 110*a* may be directly above the layer 710*b* of the second piezoelectric material 110*b* and the second layer 710*c* of the first piezoelectric material 110*a* may be directly below the layer 710*b* of the second piezoelectric material 110*b*). A first electrode 706*a* may be coupled to the first layer 710*a* of the first piezoelectric material 110*a*. A second electrode 706*b* may be coupled to the second layer 710*c* of the first piezoelectric material 110*a*.

The first piezoelectric material 110*a* may have a first volume (from both the first layer 710*a* of the first piezoelectric material 110*a* and the second layer 710*c* of the first piezoelectric material 110*a*) and the second piezoelectric material 110*b* may have a second volume (from the layer 710*b* of the second piezoelectric material 110*b*). By adjusting the ratio 126 between the first volume and the second volume, the composite quality factor (Q) 118 and the composite electromechanical coupling ($kt^2$) 122 of the composite piezoelectric material 708 may be adjusted. For example, if the first piezoelectric material 110*a* has a high quality factor (Q) 112*a* but a low electromechanical coupling ($kt^2$) 116*a* and a higher composite quality factor (Q) 118 is desired (at the expense of composite electromechanical coupling ($kt^2$) 122), the first volume may be increased relative to the second volume.

Figure 8:
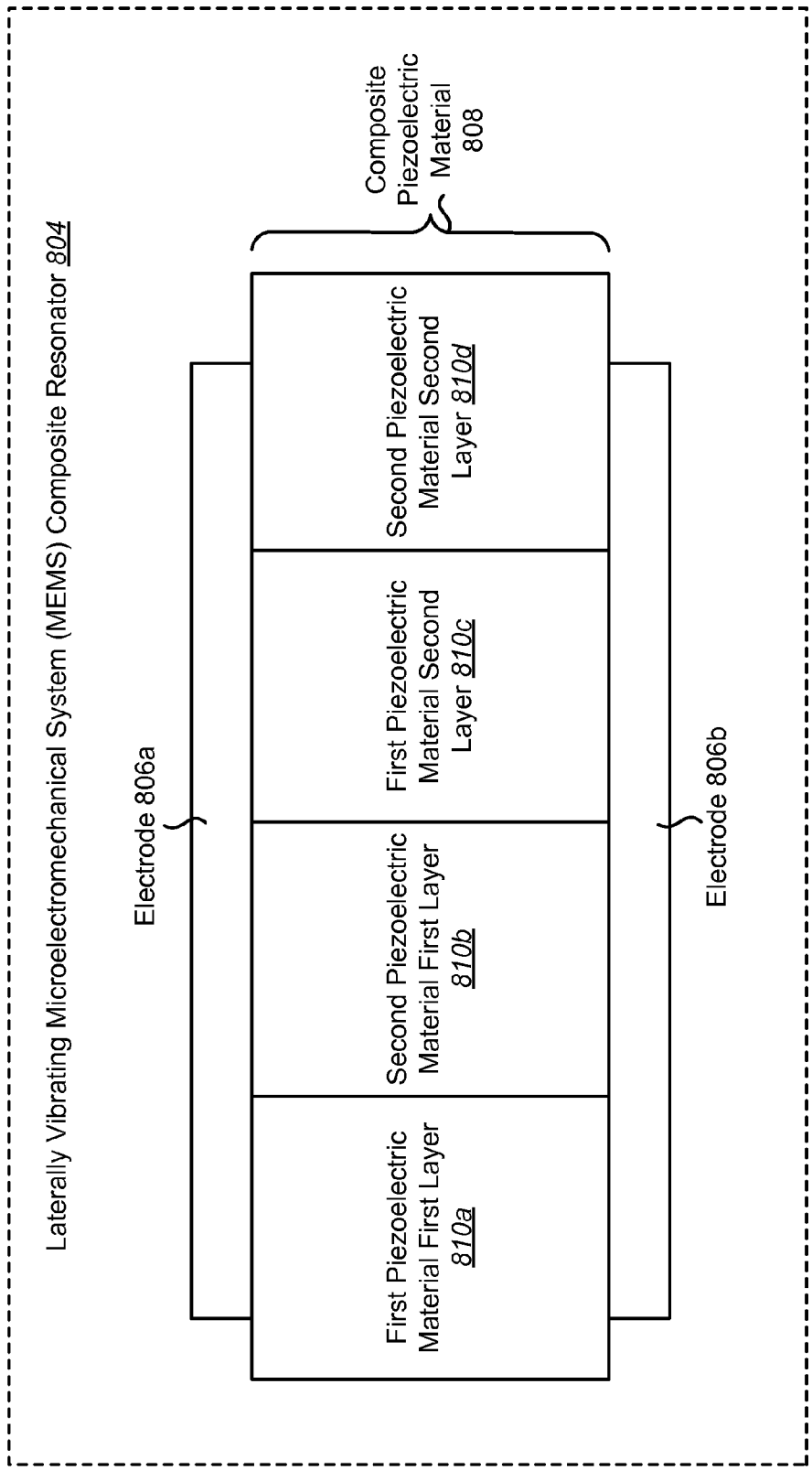
FIG. 8 is a block diagram illustrating a laterally vibrating microelectromechanical system (MEMS) composite resonator with four horizontal layers of piezoelectric material.

FIG. 8 is a block diagram illustrating a laterally vibrating microelectromechanical system (MEMS) composite resonator 804 with four horizontal layers 810*a-d* of piezoelectric material 110. The laterally vibrating microelectromechanical system (MEMS) composite resonator 804 of FIG. 8 may be one configuration of the laterally vibrating microelectromechanical system (MEMS) composite resonator 104 of FIG. 1. The laterally vibrating microelectromechanical system (MEMS) composite resonator 804 may include a composite piezoelectric material 808 that includes a first piezoelectric material 110*a* and a second piezoelectric material 110*b*.

In one configuration, the composite piezoelectric material 808 may include a first piezoelectric material first layer 810*a*, a second piezoelectric material first layer 810*b*, a first piezoelectric material second layer 810*c* and a second piezoelectric material second layer 810*d*. The second piezoelectric material first layer 810*b* may be sandwiched between the first piezoelectric material first layer 810*a* and the first piezoelectric material second layer 810*c*. The first piezoelectric material second layer 810*c* may be sandwiched between the second piezoelectric material first layer 810*b* and the second piezoelectric material second layer 810*d*.

A first electrode 806*a* may be coupled to the top of the first piezoelectric material first layer 810*a*, the second piezoelectric material first layer 810*b*, the first piezoelectric material second layer 810*c* and the second piezoelectric material second layer 810*d*. A second electrode 806*b* may be coupled to the bottom of the first piezoelectric material first layer 810*a*, the second piezoelectric material first layer 810*b*, the first piezoelectric material second layer 810*c* and the second piezoelectric material second layer 810*d*.

The first piezoelectric material 110*a* may have a first volume (from both the first piezoelectric material first layer 810*a* and the first piezoelectric material second layer 810*c*) and the second piezoelectric material 110*b* may have a second volume (from both the second piezoelectric material first layer 810*c* and the second piezoelectric material second layer 810*d*). By adjusting the ratio 126 between the first volume and the second volume, the composite quality factor (Q) 118 and the composite electromechanical coupling ($kt^2$) 122 of the composite piezoelectric material 808 may be adjusted. For example, if the first piezoelectric material 110*a* has a high electromechanical coupling ($kt^2$) 116*a* but a low quality factor (Q) 112*a* and a higher composite electromechanical coupling ($kt^2$) 122 is desired (at the expense of the composite quality factor (Q) 118), the first volume may be increased relative to the second volume.

Figure 9:
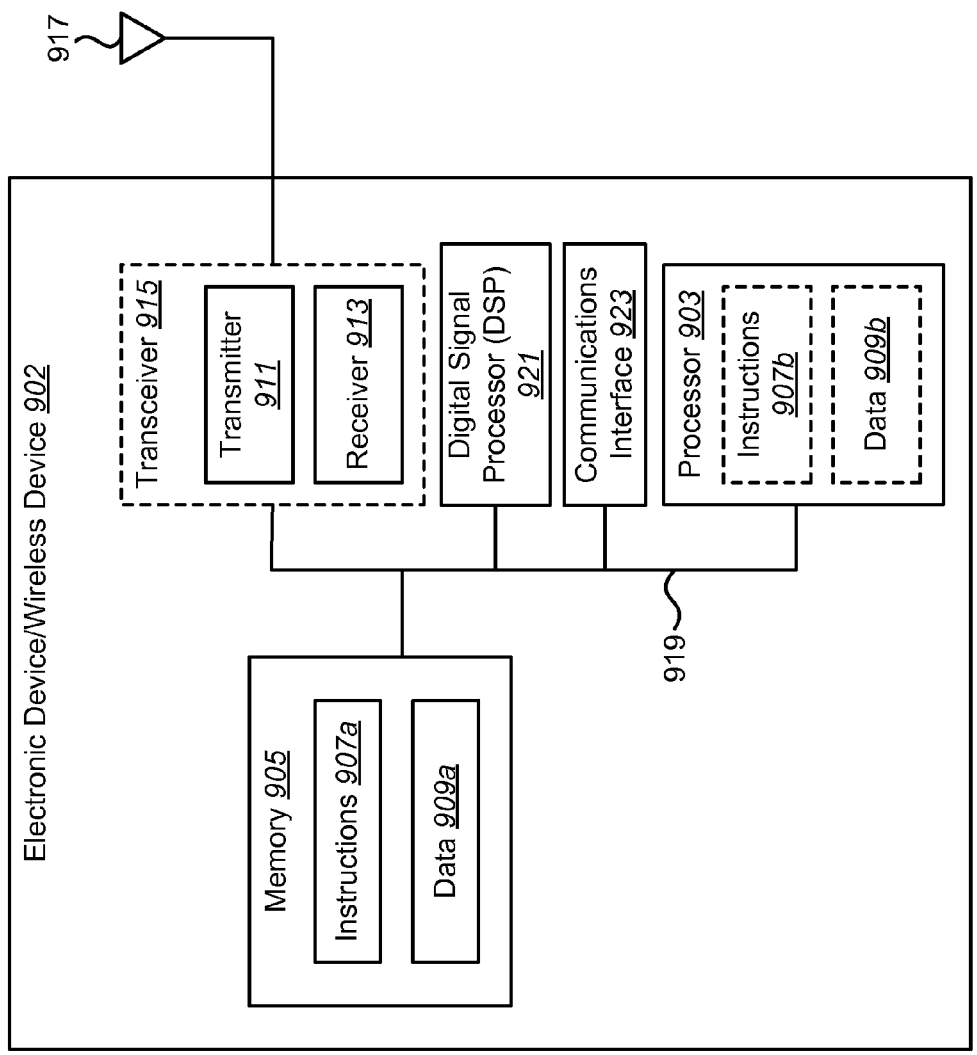
FIG. 9 illustrates certain components that may be included within an electronic device/wireless device.

FIG. 9 illustrates certain components that may be included within an electronic device/wireless device 902. The electronic device/wireless device 902 may be an access terminal, a mobile station, a wireless communication device, a base station, a Node B, a handheld electronic device, etc. The electronic device/wireless device 902 includes a processor 903. The processor 903 may be a general purpose single- or multi-chip microprocessor (e.g., an ARM), a special purpose microprocessor (e.g., a digital signal processor (DSP)), a microcontroller, a programmable gate array, etc. The processor 903 may be referred to as a central processing unit (CPU). Although just a single processor 903 is shown in the electronic device/wireless device 902 of FIG. 9, in an alternative configuration, a combination of processors (e.g., an ARM and DSP) could be used.

The electronic device/wireless device 902 also includes memory 905. The memory 905 may be any electronic component capable of storing electronic information. The memory 905 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 909*a* and instructions 907*a* may be stored in the memory 905. The instructions 907*a* may be executable by the processor 903 to implement the methods disclosed herein. Executing the instructions 907*a* may involve the use of the data 909*a* that is stored in the memory 905. When the processor 903 executes the instructions 907*a*, various portions of the instructions 907*b* may be loaded onto the processor 903, and various pieces of data 909*b* may be loaded onto the processor 903.

The electronic device/wireless device 902 may also include a transmitter 911 and a receiver 913 to allow transmission and reception of signals to and from the electronic device/wireless device 902. The transmitter 911 and receiver 913 may be collectively referred to as a transceiver 915. An antenna 917 may be electrically coupled to the transceiver 915. The electronic device/wireless device 902 may also include (not shown) multiple transmitters, multiple receivers, multiple transceivers and/or multiple antennas.

The electronic device/wireless device 902 may include a digital signal processor (DSP) 921. The electronic device/wireless device 902 may also include a communications interface 923. The communications interface 923 may allow a user to interact with the electronic device/wireless device 902.

The various components of the electronic device/wireless device 902 may be coupled together by one or more buses, which may include a power bus, a control signal bus, a status signal bus, a data bus, etc. For the sake of clarity, the various buses are illustrated in FIG. 9 as a bus system 919.

The techniques described herein may be used for various communication systems, including communication systems that are based on an orthogonal multiplexing scheme. Examples of such communication systems include Orthogonal Frequency Division Multiple Access (OFDMA) systems, Single-Carrier Frequency Division Multiple Access (SC-FDMA) systems, and so forth. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read-only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may include RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers. It should be noted that a computer-readable medium may be tangible and non-transitory. The term "computer-program product" refers to a computing device or processor in combination with code or instructions (e.g., a "program") that may be executed, processed or computed by the computing device or processor. As used herein, the term "code" may refer to software, instructions, code or data that is/are executable by a computing device or processor.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 4, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read-only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A resonator, comprising:
   multiple electrodes; and
   a composite piezoelectric material that comprises at least one layer of a first piezoelectric material that is coupled to at least one layer of a second piezoelectric material via a ground layer, wherein the first piezoelectric material and the second piezoelectric material are different piezoelectric materials, wherein at least one electrode is coupled to a bottom of the composite piezoelectric material, and wherein at least one electrode is coupled to a top of the composite piezoelectric material;
   wherein the resonator is a laterally vibrating microelectromechanical system composite resonator.

2. The resonator of claim 1, wherein the first piezoelectric material comprises a first quality factor and a first electromechanical coupling, and wherein the second piezoelectric material comprises a second quality factor and a second electromechanical coupling.

3. The resonator of claim 2, wherein the composite piezoelectric material comprises a composite quality factor and a composite electromechanical coupling, and wherein the composite quality factor and the composite electromechanical coupling depend on a volume ratio in the composite piezoelectric material between the first piezoelectric material and the second piezoelectric material.

4. The resonator of claim 2, wherein the composite piezoelectric material comprises a composite quality factor and a composite electromechanical coupling, and wherein the composite quality factor and the composite electromechanical coupling depend on a thickness ratio in the composite piezoelectric material between a first thickness of a first layer of the first piezoelectric material and a second thickness of a first layer of the second piezoelectric material.

5. The resonator of claim 1, wherein the composite piezoelectric material comprises:
   a first layer of the first piezoelectric material; and
   a first layer of the second piezoelectric material.

6. The resonator of claim 5, wherein the first layer of the first piezoelectric material is stacked on top of the first layer of the second piezoelectric material.

7. The resonator of claim 6, wherein the composite piezoelectric material further comprises a second layer of the first piezoelectric material, and wherein the first layer of the second piezoelectric material is stacked on top of the second layer of the first piezoelectric material.

8. The resonator of claim 7, wherein the composite piezoelectric material further comprises a second layer of the second piezoelectric material, and wherein the second layer of the first piezoelectric material is stacked on top of the second layer of the second piezoelectric material.

9. The resonator of claim 5, wherein the first layer of the first piezoelectric material is stacked side by side with the first layer of the second piezoelectric material, wherein a first electrode is coupled to the top of both the first layer of the first piezoelectric material and the first layer of the second piezoelectric material, and wherein a second electrode is coupled to the bottom of both the first layer of the first piezoelectric material and the first layer of the second piezoelectric material.

10. The resonator of claim 9, wherein the composite piezoelectric material further comprises a second layer of the first piezoelectric material, and wherein the first layer of the second piezoelectric material is sandwiched between the first layer of the first piezoelectric material and the second layer of the first piezoelectric material.

11. The resonator of claim 10, wherein the composite piezoelectric material further comprises a second layer of the second piezoelectric material, and wherein the second layer of the first piezoelectric material is sandwiched between the first layer of the second piezoelectric material and the second layer of the second piezoelectric material.

12. The resonator of claim 1, wherein the composite piezoelectric material translates input signals from one or more input electrodes into mechanical vibrations, and wherein the mechanical vibrations are translated to an output signal from one or more output electrodes.

13. The resonator of claim 1, wherein the first piezoelectric material is aluminum nitride, and wherein the second piezoelectric material is zinc oxide.

14. The resonator of claim 1, wherein the first piezoelectric material is aluminum nitride, and wherein the second piezoelectric material is lead zirconate titanate.

15. The resonator of claim 1, wherein the composite piezoelectric material has a high enough composite quality factor and composite electromechanical coupling for use in wideband filter applications.

\* \* \* \* \*